(12) United States Patent
Baba

(10) Patent No.: US 9,159,859 B2
(45) Date of Patent: Oct. 13, 2015

(54) SOLAR CELL MODULE

(75) Inventor: Toshiaki Baba, Kobe (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 1367 days.

(21) Appl. No.: 12/375,768

(22) PCT Filed: Jul. 31, 2007

(86) PCT No.: PCT/JP2007/064978
§ 371 (c)(1),
(2), (4) Date: Mar. 16, 2009

(87) PCT Pub. No.: WO2008/016043
PCT Pub. Date: Feb. 7, 2008

(65) Prior Publication Data
US 2009/0308427 A1    Dec. 17, 2009

(30) Foreign Application Priority Data

Jul. 31, 2006   (JP) .................................. 2006-208790

(51) Int. Cl.
| | |
|---|---|
| *H01L 31/00* | (2006.01) |
| *H01L 31/05* | (2014.01) |
| *H01L 31/0224* | (2006.01) |
| *H01L 31/042* | (2014.01) |
| *H01L 31/02* | (2006.01) |

(52) U.S. Cl.
CPC ............ *H01L 31/0504* (2013.01); *H01L 31/02* (2013.01); *H01L 31/02013* (2013.01); *H01L 31/022425* (2013.01); *H01L 31/042* (2013.01); *H01L 31/0224* (2013.01); *H01L 31/05* (2013.01); *Y02E 10/50* (2013.01)

(58) Field of Classification Search
CPC .................. H01L 31/0224; H01L 31/022425; H01L 31/022433; H01L 31/042; H01L 31/05; H01L 31/0504
USPC .................................. 136/246, 252, 255, 258
See application file for complete search history.

(56) References Cited

U.S. PATENT DOCUMENTS

| | | | | |
|---|---|---|---|---|
| 4,753,683 | A | * | 6/1988 | Ellion et al. .................. 136/244 |
| 5,421,909 | A | * | 6/1995 | Ishikawa et al. .............. 136/256 |
| 5,717,255 | A | * | 2/1998 | Haga et al. .................... 257/781 |
| 5,972,732 | A | * | 10/1999 | Gee et al. ......................... 438/66 |

(Continued)

FOREIGN PATENT DOCUMENTS

| | | |
|---|---|---|
| DE | 10109643 A1 | 9/2002 |
| JP | 51-132973 | 10/1976 |

(Continued)

*Primary Examiner* — Matthew Martin
(74) *Attorney, Agent, or Firm* — Marvin A. Motsenbocker; Mots Law, PLLC

(57) ABSTRACT

Disclosed is a solar cell module including: a plurality of solar cell units each including a supporting substrate 30 and an even number of solar cells 20 disposed on the supporting substrate 30; and a conductor 10 configured to electrically connecting surfaces of adjacent solar cells 20 that have opposite surface polarities and are formed in respective solar cell units adjacent to each other. The solar cells 20 having the opposite surface polarities are alternately arranged in each of the solar cell units so that the surface polarities of the adjacent solar cells 20 are opposite to each other, and the solar cell unit has one or more sets of two solar cells electrically connected to each other on the supporting substrate 30.

14 Claims, 7 Drawing Sheets

(56) References Cited

U.S. PATENT DOCUMENTS

2004/0255999 A1* 12/2004 Matsushita et al. ........... 136/244
2005/0139252 A1   6/2005 Shim
2006/0260673 A1* 11/2006 Takeyama .................... 136/252

FOREIGN PATENT DOCUMENTS

| | | |
|---|---|---|
| JP | 56-158486 A | 12/1981 |
| JP | 57-59462 A | 4/1982 |
| JP | 63-44460 | 3/1988 |
| JP | 63-278279 A | 11/1988 |
| JP | 01-501433 A | 5/1989 |
| JP | 02-134877 A | 5/1990 |
| JP | 11-354822 A | 12/1999 |
| JP | 2000-315811 A | 11/2000 |
| JP | 2002-026361 A | 1/2002 |
| WO | 8701513 A2 | 3/1987 |

* cited by examiner

FIG. 4    PLAN VIEW
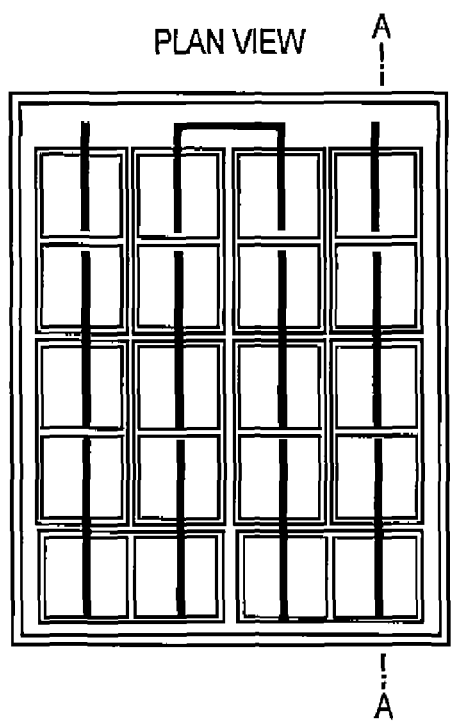
FIG. 5    BACK VIEW
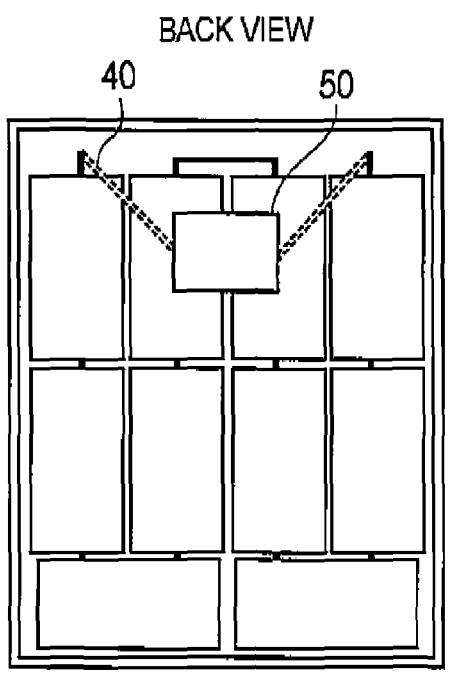
FIG. 6    CROSS-SECTIONAL VIEW
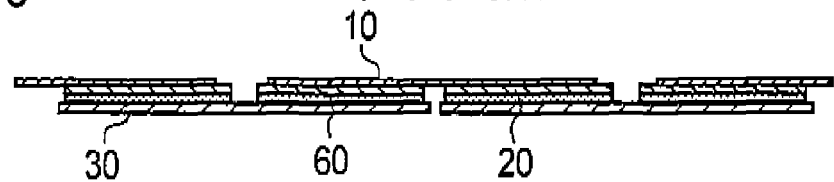

SOLAR CELL MODULE

TECHNICAL FIELD

The present invention relates to a solar cell module.

BACKGROUND ART

A solar cell module (refer to, for example, Patent Document 1) has been so far disclosed in which, as shown in FIG. 19, the surfaces of alternately arranged p-on-n solar cells 1a and n-on-p solar cells 1b are connected in series to each other through interconnectors 4 and the light-receiving surface is covered with a single transparent cover plate 3. Such a solar cell module has an advantage of allowing simplification of the structure of the interconnector 4 making connection between two solar cells, thereby eliminating a complicated wiring work for passing the interconnector 4 from the back to the front.

On the other hand, reduction in the thickness of a wafer is now desired for the purpose of reducing the manufacturing cost. A wafer thickness as thin as 100 μm or less, however, results in significant reduction of the strength of the wafer. Accordingly, a general process of manufacturing a solar cell module is difficult to directly apply.

According to the structure of a solar cell module shown in Patent Document 1, a wafer is thus pasted on a substrate 6. This allows reinforcement of the wafer as well as simplification of wiring work. It is therefore considered that the production yield of the solar cell module is increased.
Patent Document 1: Japanese Unexamined Patent Application Publication NO. Sho 63-278279

DISCLOSURE OF THE INVENTION

However, even in the solar cell module shown in the aforementioned Patent Document 1, a thin wafer is sometimes broken during pasting work because the wafer is pasted on the substrate 6. There is a problem that, if such a breaking occurs during pasting work, the solar cell module itself becomes faulty, resulting in reduction in the production yield of the solar cell module.

In consideration of the above problem, an object of the present invention is to provide a solar cell module allowing the improvement of the production yield thereof.

An aspect of the present invention is summarized as follows. A solar cell module includes: a plurality of solar cell units each including a supporting substrate and an even number of solar cells disposed on the supporting substrate; and a conductor electrically connecting surfaces of adjacent solar cells between respective adjacent solar cell units that have opposite surface polarities. Adjacent solar cells in each of the plurality of solar cell units are alternately arranged so that the surface polarities of the adjacent solar cells are opposite to each other, and each of the plurality of solar cell units has one or more sets of two solar cells electrically connected to each other on the supporting substrate.

The solar cell module according to the aspect of the present invention makes it possible to reduce an effect of the increased number of the solar cells constructing the solar cell module on yield in pasting the solar cell, resulting in the increase in production yield in modularization.

In the solar cell module according to the aspect of the present invention, in a column in which a plurality of solar cells included in the plurality of solar cell units are connected in series in one direction, a solar cell located at each end of the column is electrically connected to an adjacent solar cell in an adjacent solar cell unit by the conductor.

This solar cell module allows the number of columns to be increased without providing a wiring space outside the solar cell because electrical connection is not made between adjacent columns in the solar cell unit by the supporting substrate. As a result, a freedom degree of a module size can be increased.

The solar cell module according to the aspect of the present invention may include an even number of columns in which a plurality of solar cells included in the plurality of solar cell units are connected in series in one direction.

This solar cell module allows a wiring extending to a terminal box to be shortened because positive and negative terminals can be placed at the same end of the columns of the module.

In the solar cell module according to the aspect of the present invention, the supporting substrate may be transparent.

The solar cell module allows light incoming from the back-surface side to enter the solar cell when the supporting substrate is disposed on the back-surface side opposite to the light-receiving-surface side. Consequently, the light incoming from the back-surface side can be utilized, resulting in further improvement in the output of the solar cell module.

BRIEF DESCRIPTION OF THE DRAWINGS

FIG. 4 is a plane view showing the solar cell module according to the first embodiment (second one).

FIG. 5 is a back view showing the solar cell module according to the first embodiment.

FIG. 6 is a cross-sectional view showing the solar cell module according to the first embodiment.

BEST MODES FOR CARRYING OUT THE INVENTION

Embodiments of the present invention will then be described with reference to the drawings. In the representation of the following drawings, the same or similar parts are given the same or similar symbols. However, it should be noted that the drawings are diagrammatic and each ratio or the like of dimensions is different from the actual one. Therefore, specific dimensions or the like should be determined in consideration of the following description. Also, the parts having difference in the relationship and ratio of the dimensions among the drawings are of course included.

First Embodiment (Solar Cell)

A solar cell according to a first embodiment is manufactured by the following manufacturing method.

Firstly, an n-type single crystal silicon wafer (100 mm square, 100 μm thickness) having a (100) surface as a plain orientation is anisotropically etched by an alkaline water solution to form fine asperity on the surface. Thereafter, an n-type single crystal silicon wafer is washed in a usual manner to remove impurities on the surface.

A 5 nm i-type a-Si:H layer and a 5 nm p-type a-Si:H layer are then sequentially stacked on the one main surface by a plasma CVD method. Subsequently, a 5 nm i-type a-Si:H layer and a 5 nm n-type a-Si:H layer are then sequentially stacked on the other main surface. A method of forming a semiconductor junction is not limited to the above mentioned method.

An ITO layer is then formed on each of the p-type a-Si:H layer and the n-type a-Si:H layer by a spattering method.

Subsequently, a Ag paste is screen-printed on the ITO layer formed on the p-type a-Si:H layer and thermally cured at 150° C. to 250° C. to form a light-receiving-surface side electrode. A solar cell 20 shown in FIG. 1 includes one bus bar electrode 15, but can also include more bus bar electrodes. A plurality of finger electrodes (not shown) is also formed on the ITO layer so as to be perpendicular to the bus bar electrode 15.

On the other hand, Ag is deposited on the ITO layer formed on the n-type a-Si:H layer by a spattering method to form a back-surface side electrode. Note that the back-surface side electrode may be formed by a printing method as similar to the light-receiving-surface side electrode.

The solar cell according to the first embodiment may be manufactured by a method of preparing an n-type single crystal silicon wafer having surfaces with fine asperity formed thereon and applying impurities containing P and B on the front and back surfaces of the wafer, respectively, and heating the wafer to form an n+ layer and a p+ layer on the surface, in addition to the aforementioned method. Note that a diffusion method is not limited to this and may be an ion-implantation method. An anti-reflection film may be formed on the light-receiving surface as necessary.

(Solar Cell Unit)

Figure 1:
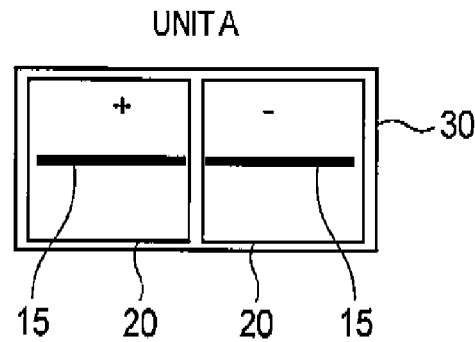
FIG. 1 is a plane view showing a solar cell unit according to a first embodiment (first one).

As shown in FIG. 1, the solar cell unit according to the first embodiment includes a supporting substrate 30 and an even number of solar cells 20 arranged on the supporting substrate 30. Note that, in FIG. 1 and the following figures, signs "+" and "−" represent that p-type Si is exposed on a surface given a sign "+", and n-type Si is exposed on a surface given a sign "−".

A SUS plate having a thickness of approximately 0.1 mm may be used as the supporting substrate 30. In addition, a metal sheet having a suitable thickness of Cu, Al, or the like and a metal sheet further coated with a metal may be used. The material used herein may not necessarily be a single element and may be an alloy. A surface on which the solar cells 20 are pasted and the opposite surface may be insulated from each other by resin coating and the like. Furthermore, the supporting substrate 30 may be an insulating material, such as polyimide, PET, glass epoxy, glass, ceramics and the like, coated with a metal. The insulating material may be treated to increase the adhesion performance of the metal coat before coated with the metal (plasma treatment and the like). The use of an insulating material makes it possible to prevent a short circuit from occurring due to contact between supporting substrates 30. Also, the supporting substrate 30 may be one covering the entire or may have a hole. Furthermore, the supporting substrate 30 may be transmissive.

A solar cell unit is formed by placing solar cells on a SUS plate applied with a thermosetting Ag paste on the entire surface and bonding the solar cells to the SUS plate by thermosetting the Ag paste while pressing the solar cells. A wafer having a small thickness is more likely to cause the solar cell to be broken in a process of printing the light-receiving-surface side electrode. In such a case, the solar cell may be pasted on the supporting substrate 30 before printing. One or more kinds of adhesives may be used for the pasting.

Figure 2:
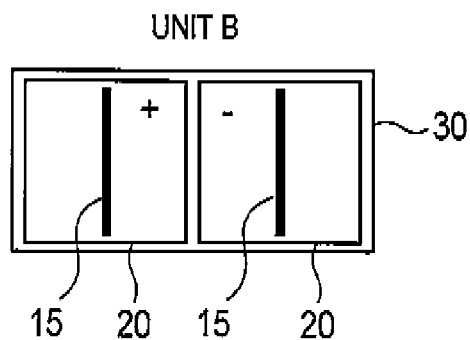
FIG. 2 is a plane view showing the solar cell unit according to the first embodiment (second one).

In the first embodiment, a unit A shown in FIG. 1 and a unit B shown in FIG. 2 are manufactured.

As shown in FIG. 1, in the unit A, two solar cells 20 adjacent to each other are arranged so that polarities thereof on the light-receiving-surface side are opposite to each other. The two solar cells 20 are electrically connected to each other on the surface of the supporting substrate 30. The bus bar electrodes 15 extend in parallel to a row direction of the solar cells 20.

As shown in FIG. 2, in the unit B, two solar cells 20 adjacent to each other are arranged so that polarities thereof on the light-receiving-surface side are opposite to each other. The two solar cells 20 are electrically connected to each other on the surface of the supporting substrate 30. The bus bar electrodes 15 extend in a direction perpendicular to a row direction of the solar cells 20.

(Solar Cell Module)

Figure 3:
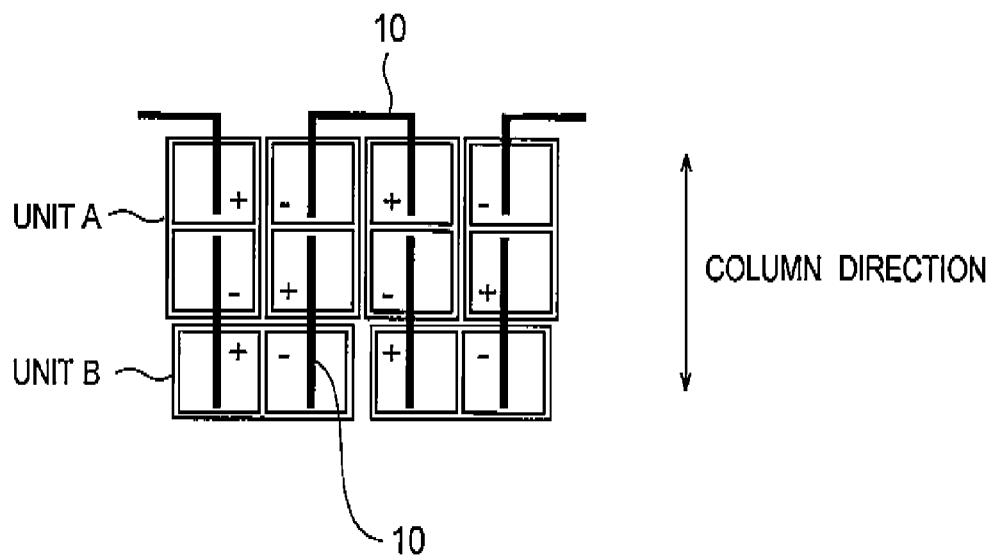
FIG. 3 is a plane view showing the solar cell module according to the first embodiment (first one).

As shown in FIG. 3, the solar cell module according to the first embodiment includes solar cell units (units A and units B) and conductors 10 electrically connecting the surfaces of adjacent solar cells having an opposite surface polarity between adjacent solar cell units.

For example, a lead wire (2 mm wide and 150 μm thick) coated with a copper foil using a solder is used as the conductor 10. The conductor 10 is soldered to a bus bar electrode formed on the surface of the solar cell. This soldering electrically connects the solar cell units. All the conductors 10 can be attached on the same side.

If the units A and units B are arranged in the manner shown in FIG. 3, a wiring space for connecting columns can be eliminated on one side.

An overall view of the solar cell module according to the first embodiment is shown in FIGS. 4 to 6. FIG. 4 is a plane view. FIG. 5 is a back view. FIG. 6 is a cross-sectional view taken along line A-A of FIG. 4.

As shown in FIG. 6, in the solar cell module, the solar cells 20 are pasted on the supporting substrate 30 with a conductive adhesive 60 and the solar cells are connected to each other with conductors 10. When the top surface in FIG. 6 is a light-receiving surface, a light-receiving-surface side protecting member made of glass or the like is bonded on the top surface in FIG. 6 with an adhesive resin such as EVA or the like. A resin film is bonded on the bottom surface in FIG. 6 with an adhesive resin such as EVA or the like. As shown in FIG. 5, a wiring 40 with insulating coating is then formed between the solar cell and a terminal box 50 for taking out power on the back surface side of the solar cell module. A frame body is attached to the outer circumference. A by-pass diode is attached between terminals as necessary.

As shown in FIG. 4, the solar cell module according to the first embodiment includes an even number of columns in which the plurality of solar cells is connected in series in one direction.

(Operation and Effect)

The solar cell module according to the first embodiment includes the plurality of solar cell units including the supporting substrate 30 and an even number of solar cells 20 arranged on the supporting substrate and conductors 10 electrically connecting surfaces of adjacent solar cells having an opposite surface polarity between adjacent solar cell units. The adjacent solar cells 20 in the solar cell unit are arranged so as to alternately have an opposite surface polarity. The solar cell unit has one or more sets each composed of two solar cells electrically connected to each other on the surface of the supporting substrate.

The solar cell module according to the first embodiment makes it possible to reduce an effect of the increased number of the solar cells constructing the solar cell module on yield in pasting the solar cell, resulting in increase in production yield in modularization.

Even if a failure occurs during making connection between the solar cell units or a failure is found after making connection between the solar cell units, only the failure unit can also be replaced before modularization. A failure point can easily be corrected in the above-described manner.

The solar cell module according to the first embodiment includes an even number of columns in which the plurality of solar cells is connected in series in one direction. For example, in FIG. 4, the solar cell module is constructed of the solar cells arranged in four columns. Accordingly, a wiring extending to the terminal box 50 can be shortened because positive and negative terminals can be placed at the one end (top end in FIG. 5) of the module. Also, a wiring space between columns can be eliminated on one side, resulting in improvement in an output per unit area of the solar cell module.

In the solar cell module according to the first embodiment, the supporting substrate 30 is preferably transmissive. The supporting substrate 30 may be arranged in either of the light-receiving-surface side or the back-surface side. When arranged on the light-receiving-surface side, the supporting substrate 30 needs to be transmissive. On the other hand, when the supporting substrate 30 is disposed on the back-surface side, the light incoming from the back-surface side is allowed to enter the solar cell. The light incoming from the back-surface side can consequently be utilized, resulting in further increase in the output of the solar cell module.

Second Embodiment

A solar cell 20 according to a second embodiment is the same as in the first embodiment. Therefore, the description of the solar cell 20 is eliminated.

(Solar Cell Unit)

A solar cell unit according to the second embodiment is formed by coating a supporting substrate made of a polyimide sheet with Ag by a spattering method and by bonding a solar cells to the support substrate with a Ag paste.

Figure 7:
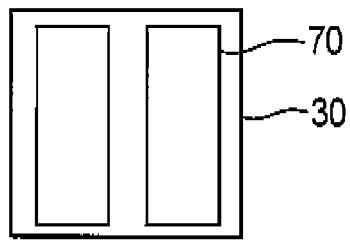
FIG. 7 is a plane view showing a supporting substrate according to a second embodiment (first one).

As shown in FIG. 7, in the solar cell unit according to the second embodiment, a Ag coat 70 is formed on the supporting substrate 30. Note that the coating metal is not limited to Ag and not restricted in kind as long as being conductive.

Figure 8:
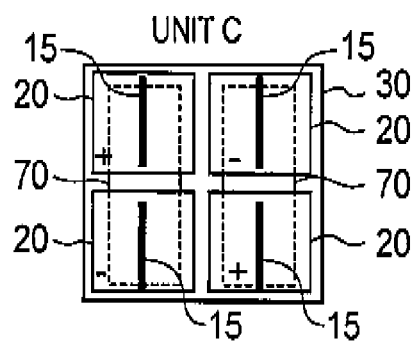
FIG. 8 is a plane view showing a solar cell unit according to the second embodiment (second one).
Figure 9:
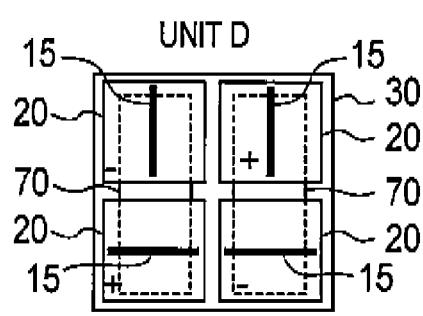
FIG. 9 is a plane view showing the solar cell unit according to the second embodiment (third one).

In the second embodiment, a unit C shown in FIG. 8 and a unit D shown in FIG. 9 are manufactured.

As shown in FIG. 8, the unit C includes four adjacent solar cells 20 arranged so as to alternately have an opposite polarity on the light-receiving-surface side. Two solar cells 20 are electrically connected to each other on the Ag coat 70 on the surface of the supporting substrate 30. Four bus bar electrodes all extend in parallel.

As shown in FIG. 9, the unit D includes four adjacent solar cells 20 arranged so as to alternately have an opposite polarity on the light-receiving-surface side. Two solar cells 20 are electrically connected to each other on the Ag coat 70 on the surface of the supporting substrate 30. Two bus bar electrodes extend in a direction perpendicular to the direction of two other parallel bus bar electrodes.

(Solar Cell Module)

Figure 10:
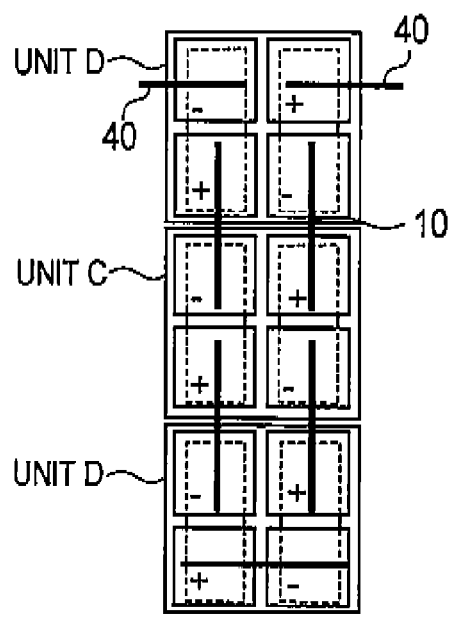
FIG. 10 is a plane view showing a solar cell module according to the second embodiment (first one).
Figure 11:
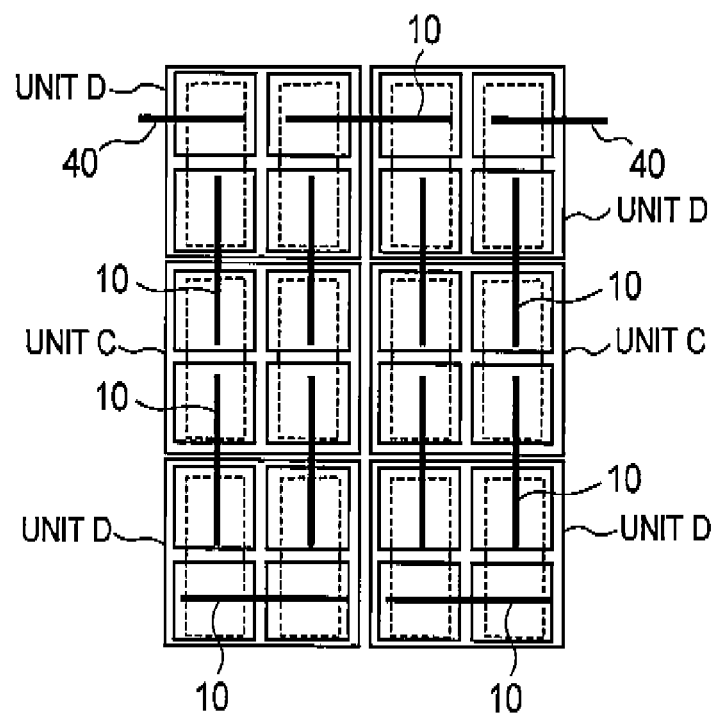
FIG. 11 is a plane view showing the solar cell module according to the second embodiment (second one).

As shown in FIG. 10, a solar cell module according to the second embodiment includes solar cell units (unit C and unit D) and conductors 10 electrically connecting the surfaces of adjacent solar cells having an opposite surface polarity between adjacent solar cell units. The use of the unit D at each end of a column makes it possible to increase the number of the column without providing a wiring space at both ends of the column as shown in FIG. 11.

(Operation and Effect)

In the solar cell module according to the second embodiment, the solar cell 20 located at each end of a column, in which the plurality of solar cells 20 are connected to each other in series in one direction, is electrically connected to the adjacent solar cell 20 in the adjacent solar cell unit by the conductor 10. Therefore, electrical connection is not made by the supporting substrate between columns adjacent to each other in a solar cell unit. Consequently, the number of columns can be increased without providing a wiring space outside the solar cell. As a result, the freedom degree of the module size can be increased. Also, a wiring space for wiring columns to each other can be eliminated, resulting in increase in the output per unit area of the solar cell module.

Third Embodiment (Solar Cell Module)

The solar cell 20 according to the first embodiment has a rectangular outside shape. In contrast, a solar cell 20 according to a third embodiment is formed in, for example, a trapezoidal shape as shown in FIGS. 12 and 13.

(Solar Cell Unit)

In a solar cell unit according to the third embodiment, solar cells 20 each having a shape other than a rectangular, for example, a trapezoidal shape, are arranged. Note that, the solar cell unit according to the third embodiment includes a Ag coats 70 formed on the supporting substrate 30 and the solar cells 20 arranged on the Ag coats 70 as in the second embodiment In the third embodiment, a unit E shown in FIG. 12 and a unit F shown in FIG. 13 are manufactured.

Figure 12:
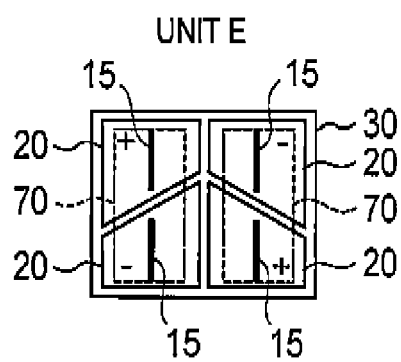
FIG. 12 is a plane view showing a solar cell unit according to a third embodiment (first one).
Figure 13:
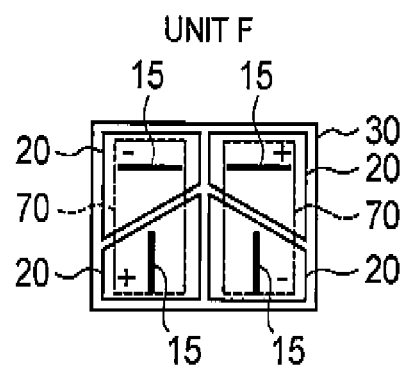
FIG. 13 is a plane view showing the solar cell unit according to the third embodiment (second one).

As shown in FIG. 12, the unit E includes four solar cells 20 adjacent to each other arranged so that the surface polarities of the four solar cells 20 adjacent to each other are opposite to each other on the light-receiving surface-side. Two solar cells 20 are electrically connected to each other on the Ag coat 70 on the surface of the supporting substrate 30. Four bus bar electrodes 15 all extend in parallel.

As shown in FIG. 13, the unit F includes four solar cells 20 adjacent to each other arranged so that the surface polarities of the four solar cells 20 adjacent to each other are opposite to each other on the light-receiving surface-side. Two solar cells 20 are electrically connected to each other on the Ag coat 70 on the surface of the supporting substrate. Two bus bar electrodes 15 extend in a direction perpendicular to the direction of two other bus bar electrodes 15 extending in parallel.

(Solar Cell Module)

Figure 14:
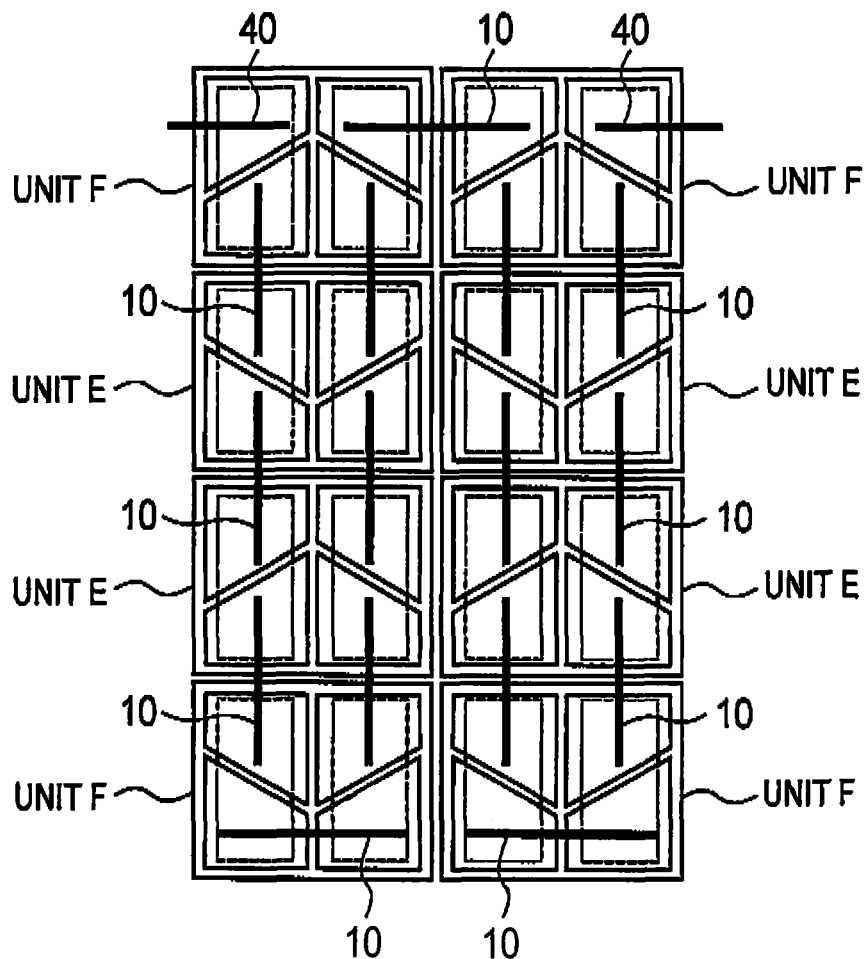
FIG. 14 is a plane view showing the solar cell module according to the third embodiment.

As shown in FIG. 14, a solar cell module according to the third embodiment includes solar cell units (units E and units F) and conductors 10 electrically connecting the surfaces of adjacent solar cells 20 having an opposite surface polarity between adjacent solar cell units. The use of the unit F at each end of a column makes it possible to increase the number of the column without providing a wiring space at both ends of the column.

(Operation and Effect)

According to the solar cell module according to the third embodiment, it can be seen that the shape of the solar cell is not limited to a rectangular shape and a solar cell having shape other the a rectangular shape may be used.

Fourth Embodiment

A solar cell 20 according to a fourth embodiment is the same as in the first embodiment. Therefore, the description thereof is now eliminated.

(Solar Cell Unit)

Figure 15:
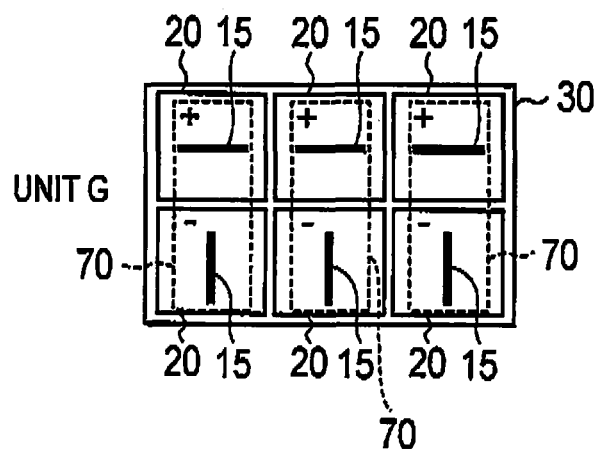
FIG. 15 is a plane view showing a solar cell unit according to a fourth embodiment.

In the fourth embodiment, a unit G shown in FIG. 15 is manufactured.

As shown in FIG. 15, the unit G includes six solar cells 20 adjacent to each other arranged so that polarities on the light-receiving-surface side are opposite to each other. Two solar cells 20 are electrically connected to each other on the Ag coat 70 on the surface of the supporting substrate 30. Three bus bar electrodes 15 extend in a direction perpendicular to the direction of three other bus bar electrodes 15 extending in parallel.

(Solar Cell Module)

Figure 16:
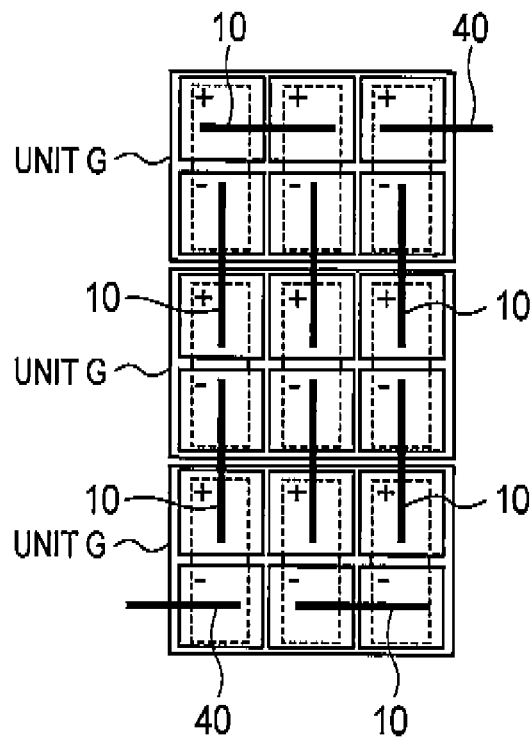
FIG. 16 is a plane view showing a solar cell module according to the fourth embodiment.
Figure 17:
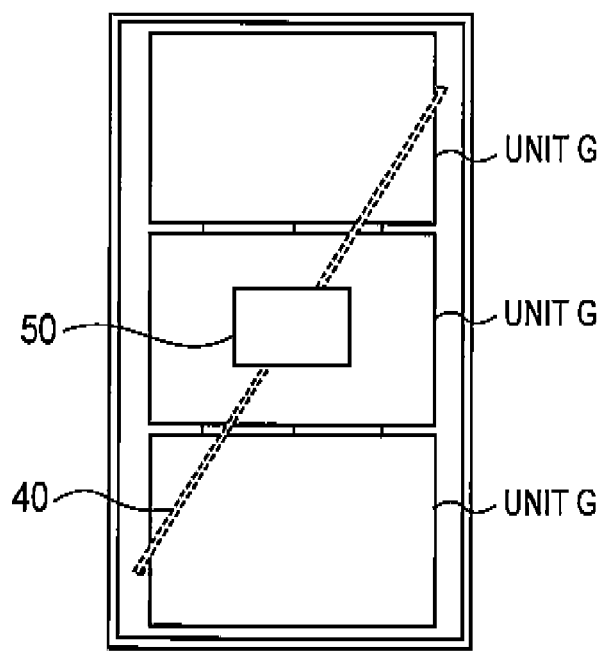
FIG. 17 is a back view showing the solar cell module according to a fourth embodiment.

As shown in FIG. 16, a solar cell module according to the fourth embodiment includes solar cell units (units G) and conductors 10 electrically connecting the surfaces of adjacent solar cells having an opposite surface polarity between adjacent solar cell units. The positive and negative terminals are diagonally taken out because the unit G is used at each end of a column and an odd number of columns (here three columns) of the solar cells 20 are arranged. Accordingly, the length of the wiring 40 is large wherever the terminal box 50 may be provided as shown in FIG. 17.

AS shown in FIG. 3(a), the length of the wiring 40 extending to the terminal box 50 can be small if the solar cell module is constructed of solar cells arranged in four columns which are even number columns.

Fifth Embodiment

A solar cell 20 according to a fifth embodiment is the same as in the first embodiment. Therefore, the description thereof is now eliminated.

(Solar Cell Unit)

Figure 18:
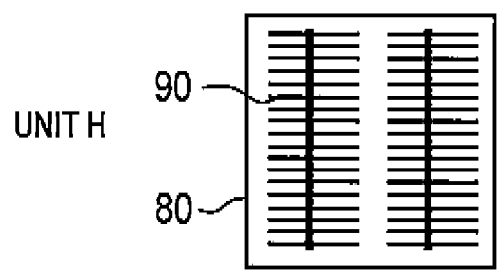
FIG. 18 is a plane view showing a solar cell unit according to a fifth embodiment.
Figure 19:
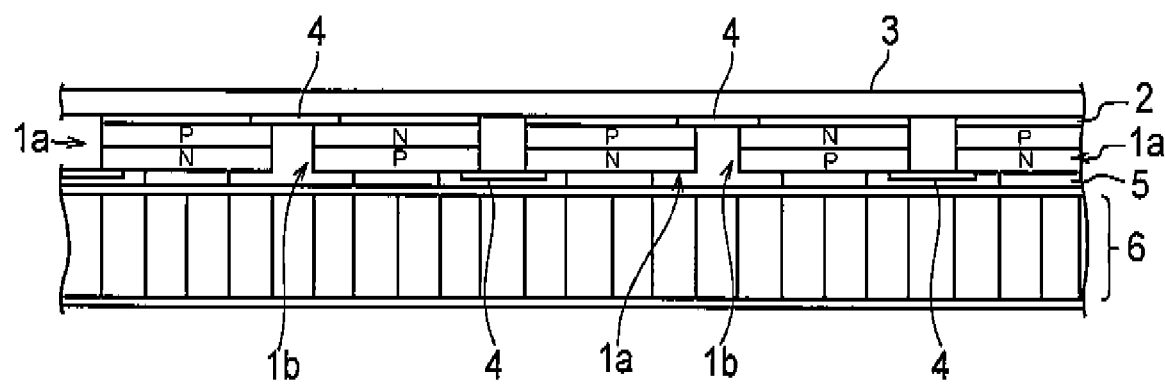
FIG. 19 is a cross-sectional view showing a conventional solar cell module.

In the fifth embodiment, a unit H shown in FIG. 18 is manufactured.

To be specific, a Ag paste is printed on a polyimide sheet 80 to form Ag electrodes 90. Then, solar cells are place and bonded while being pressed by thermosetting to form the unit H.

(Operation and Effect)

The solar cell unit (unit H) according to the fifth embodiment can be transmissive because the Ag electrodes 90 are not formed over the entire surface of the unit H. The arrangement of the polyimide sheet 80 on the back-surface side therefore allows light incoming from the back-surface side to enter the solar cell. As a result, the light incoming from the back-surface side can be utilized, resulting in further increase in the output. Note that this case requires the use of a transmissive film for the back surface member.

Other Embodiment

Although the present invention has been described on the basis of the above embodiments, the description and the drawings, which constitute part of this disclosure, should not be understood to limit this invention. Various alternative embodiments, examples and operation techniques will be apparent to those skilled in the art from this disclosure.

The description of the forgoing embodiments takes a solar cell having an HIT structure for example. The present invention may be applied to a solar cell having no HIT structure.

In addition, an ITO (Indium Tin Oxide) layer, being $In_2O_3$ doped with $SnO_2$ as an impurity, is used as a transparent conductive film. The present invention does not limit the transparent conductive film to this and permits indium oxide doped with other material to be used. Indium oxide may be doped with for example W, Mo, Ti, Si, As, Ca, Cu, F, Ge, Mg, S, Zn or the like. A plurality of these materials may be doped.

As described above, the present invention of course includes various embodiments and the like not described herein. The technological scope of the present invention is therefore determined only by claimed elements of the present invention according to the scope of claims reasonably understood from the above description.

Japanese Patent Application No. 2006-208790 (filed on Jul. 31, 2006) is incorporated herein by reference in entirety.

INDUSTRIAL APPLICABILITY

As described above, the solar cell module according to the present invention makes it possible to reduce an effect of the increased number of the solar cells constructing the solar cell module on yield in pasting the solar cell, resulting in the increase in production yield in modularization, and thus is useful.

The invention claimed is:

1. A solar cell module comprising:
a plurality of solar cell units each including a supporting substrate and an even number of solar cells disposed on the supporting substrate; and
on a front, light receiving surface side, a conductor electrically connecting surfaces of adjacent solar cells between respective adjacent solar cell units that have opposite surface polarities, wherein
adjacent solar cells in each of the plurality of solar cell units are alternately arranged so that the surface polarities of the adjacent solar cells are opposite to each other, and
each of the plurality of solar cell units has one or more sets of two solar cells electrically connected to each other on the rear side via a conductive surface on the supporting substrate,
wherein a rear side conductive surface is a conductive adhesive, and the supporting substrate has an insulating property, wherein
the plurality of solar cell units comprise a first solar cell unit and two second solar cell units, each first cell unit and second cell unit contains a set of the adjacent solar cells electrically connected by the metal surface and a set of adjacent solar cells not electrically connected by the metal surface, in the first solar cell unit two sets of adjacent solar cells are electrically connected by the metal surface wherein each set of the adjacent solar cells form a first cell column with solar cells arranged in series in one direction with a bus bar electrode on the solar cells positioned along a direction of the column, in the second solar cell unit two sets of adjacent solar cells are electrically connected by the metal surface wherein each set of the adjacent solar cells are positioned in series in one direction with a bus bar electrode make a right angle to the direction and one set of the adjacent solar cells not electrically connected by the metal surface form a second cell column with solar cells in series in one direction and each of their bus bar electrodes are positioned along a direction of the column of the solar cells, wherein in the first cell column, a solar cell located at each end of the column is electrically connected to an adjacent solar cell in an adjacent solar cell unit by the conductor, and in one of the second solar cell columns, adjacent solar cells of the column are electrically connected by the conductor.

2. The solar cell module according to claim 1, wherein there are an even number of first cell columns in which a plurality of solar cells included in the plurality of solar cell units are connected in series in one direction.

3. The solar cell module according to claim 1, wherein the supporting substrate is transmissive.

4. The solar cell module according to claim 1, wherein each rear side conductive surface contacts the entire surfaces of the corresponding solar cell pairs.

5. The solar cell module of claim 1, wherein the front side conductors extend outside only one end of the solar cell module.

6. The solar cell module of claim 5, wherein the cells of the module are connected serially and the plus and minus electrode connections only extend outside said one end of the solar cell module.

7. The solar cell module of claim 1, wherein the front side conductors do not extend outside the ends of the solar cell module.

8. The solar cell module of claim 4, wherein the front side conductors do not extend outside the ends of the solar cell module.

9. The solar cell module of claim 7, wherein only two connection electrodes extend outside the ends of the solar cell module.

10. The solar cell module of claim 1, wherein the light receiving surface side conductors comprise screen-printed silver paste.

11. The solar cell module of claim 1, wherein the rear side conductive surface comprises Ag deposited by a spattering method.

12. The solar cell module of claim 1, wherein the supporting substrate is an SUS plate having a thickness of approximately 0.1 mm.

13. The solar cell module of claim 1, wherein a wiring space for connecting columns of solar cells is lacking on one side.

14. The solar cell module of claim 1, wherein the solar cells include a bus bar on their front surface side, the bus bar orientation directions of two adjacent solar cells on a module edge are parallel to the module edge and perpendicular to two adjacent solar cells extending inwards from the module edge.

* * * * *